(12) United States Patent
Tomita (10) Patent No.: US 12,339,314 B2
(45) Date of Patent: Jun. 24, 2025

(54) PROBE CARD AND METHOD FOR REPAIRING PROBE CARD

(71) Applicant: Japan Electronic Materials Corporation, Hyogo (JP)

(72) Inventor: Yutaka Tomita, Hyogo (JP)

(73) Assignee: JAPAN ELECTRONIC MATERIALS CORPORATION, Hyogo (JP)

( * ) Notice: Subject to any disclaimer, the term of this patent is extended or adjusted under 35 U.S.C. 154(b) by 44 days.

(21) Appl. No.: 18/275,219

(22) PCT Filed: Apr. 23, 2021

(86) PCT No.: PCT/JP2021/016446
§ 371 (c)(1),
(2) Date: Aug. 1, 2023

(87) PCT Pub. No.: WO2022/224438
PCT Pub. Date: Oct. 27, 2022

(65) Prior Publication Data
US 2024/0110974 A1    Apr. 4, 2024

(51) Int. Cl.
G01R 31/28    (2006.01)
G01R 1/073    (2006.01)
G01R 3/00    (2006.01)

(52) U.S. Cl.
CPC ..... G01R 31/2889 (2013.01); G01R 1/07314 (2013.01); G01R 3/00 (2013.01)

(58) Field of Classification Search
CPC .............. G01R 1/07307; G01R 1/07342
See application file for complete search history.

(56) References Cited

U.S. PATENT DOCUMENTS 11,662,367 B2 *  5/2023  Kobayashi ......... G01R 31/2887
                                                              324/756.03
2007/0069363 A1   3/2007  Kawabata et al.
(Continued)

FOREIGN PATENT DOCUMENTS

CN    208400844 U    1/2019
JP    0862415 A    3/1996
(Continued)

OTHER PUBLICATIONS

International Search Report and Written Opinion issued in corresponding International Patent Application No. PCT/JP2021/016446 (with English translation of International Search Report) mailed Jul. 20, 2021 (13 pages).

Primary Examiner — Tung X Nguyen
(74) Attorney, Agent, or Firm — Kilyk & Bowersox, P.L.L.C.

(57) ABSTRACT

The purpose of the present invention is to provide a method for repairing a probe card in which a defect has occurred in an alignment symbol or a peripheral region thereof by using a high reflection chip for alignment. The present invention is provided with a probe 16 for contacting an inspection object, a wiring substrate 14 to which the probe 16 is attached, and a high reflection chip 4 for alignment provided to a probe installation surface 17 of the wiring substrate 14. The high reflection chip 4 includes a metal plate having a fixing through-hole 41, and has an affixing surface to be attached to the probe installation surface 17 with an adhesive 6 and a mirror-finished high reflection surface on the other side from the affixing surface. The adhesive 6 formed on the affixing surface has a ridge 61 that extends into the fixing through-hole 41.

4 Claims, 10 Drawing Sheets

(56) References Cited

U.S. PATENT DOCUMENTS

2009/0212803 A1     8/2009   Yamamoto et al.
2017/0285068 A1*   10/2017   Bocash .................... G01R 3/00

FOREIGN PATENT DOCUMENTS

| | | |
|---|---|---|
| JP | 10207039 A | 8/1998 |
| JP | 2001330626 A | 11/2001 |
| JP | 2007240787 A | 9/2007 |
| JP | 2008091681 A | 4/2008 |
| JP | 2008216300 A | 9/2008 |

* cited by examiner

FIG. 1

(a) SYMBOL SURFACE (b) A-A CROSS-SECTIONAL VIEW

(a) SYMBOL SURFACE (b) B-B CROSS-SECTIONAL VIEW

PROBE CARD AND METHOD FOR REPAIRING PROBE CARD

This application is a National Stage Application of PCT/JP2021/016446, filed Apr. 23, 2021.

TECHNICAL FIELD

The present invention relates to a probe card and a method for repairing the probe card, and more particularly to a probe card in which a high reflection chip for alignment is attached on a wiring substrate, and a method for repairing a probe card using the high reflection chip.

BACKGROUND ART

A probe card is an inspection device used for inspecting electrical characteristics of a semiconductor device formed on a semiconductor wafer, and a large number of probes to be brought into contact with electrode pads on the semiconductor wafer are provided on a wiring substrate. An alignment symbol for positioning is formed on the probe installation surface of the wiring substrate.

The semiconductor device is inspected by bringing the semiconductor wafer close to the probe card, bringing the tip of the probe into contact with the electrode pad on the semiconductor wafer, and electrically connecting a tester device to the semiconductor device via the probe and the wiring substrate. In addition, by photographing the alignment symbol with a camera before the inspection, the probe card and the semiconductor wafer are positioned (aligned) so that the tip of the probe comes into contact with the electrode pad.

Figure 9:
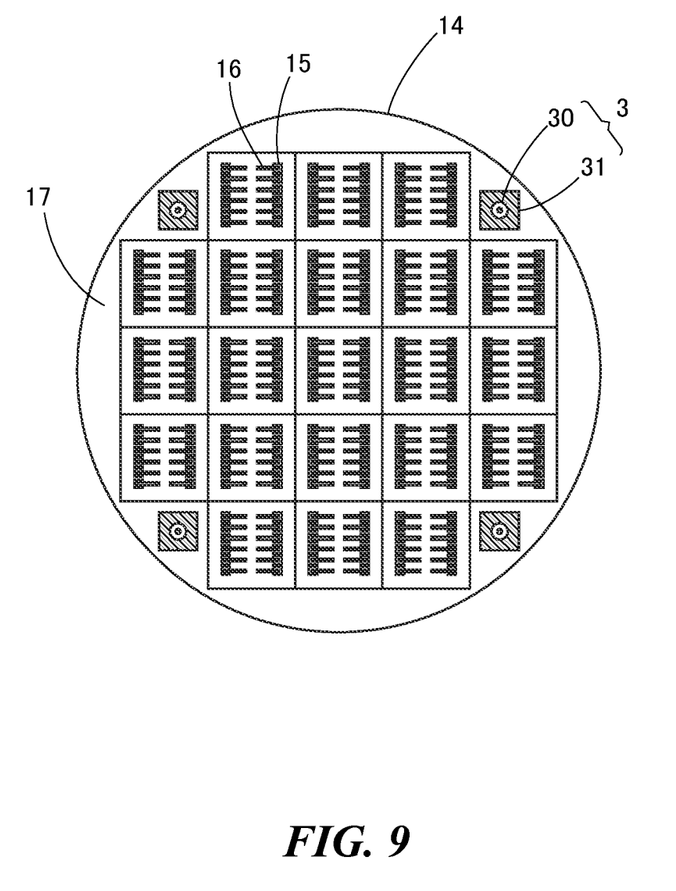
FIG. 9 is a view illustrating an example of a wiring substrate 14 forming a conventional probe card.
Figure 10:
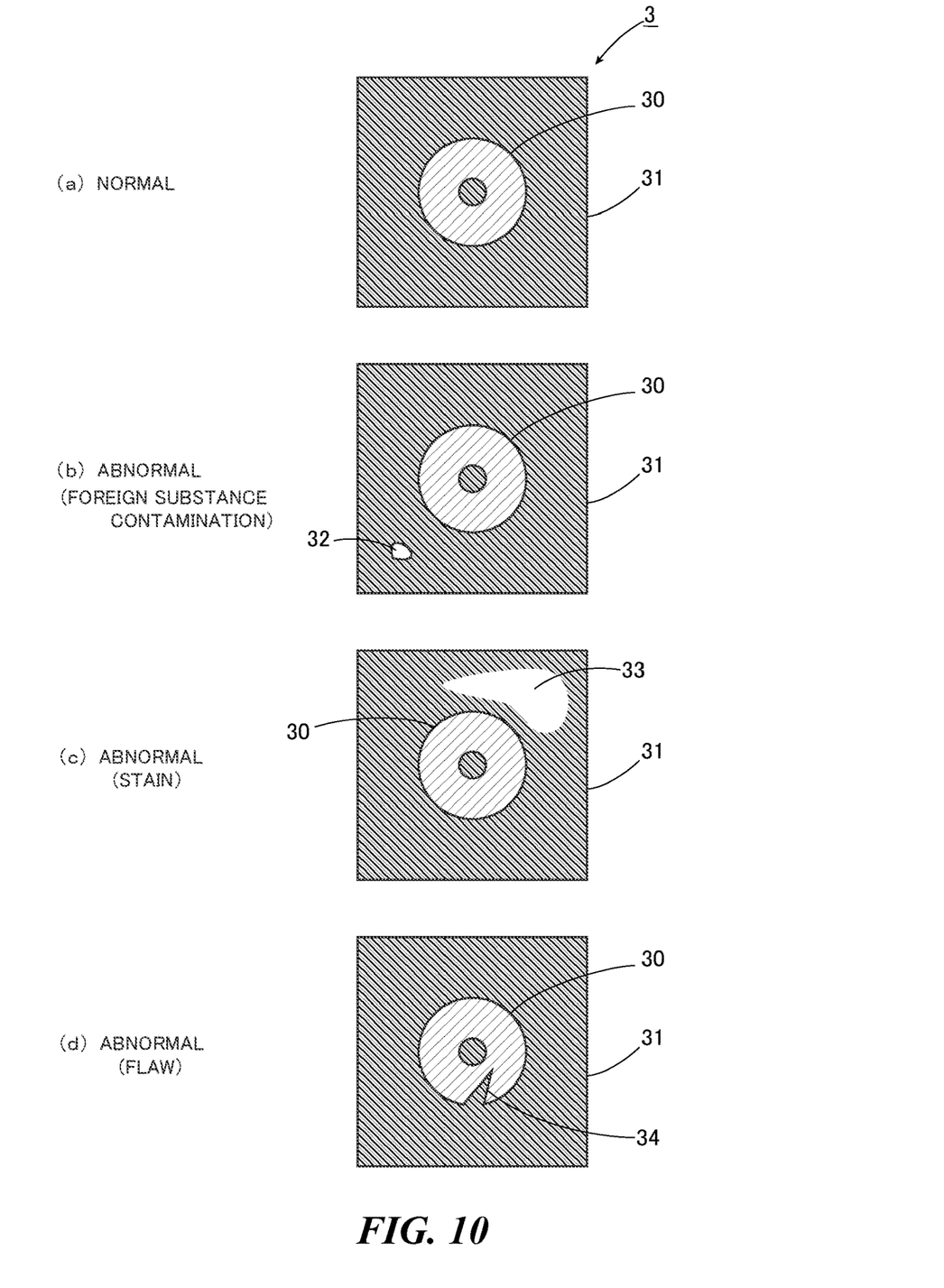
FIGS. 10(a) to 10(d) are diagrams illustrating various states that can occur in the alignment symbol 3.

FIG. 9 is a view illustrating an example of a wiring substrate 14 forming a conventional probe card, and is a view illustrating a state in which a probe installation surface 17 on which a probe is installed is viewed in a plan view. A large number of probe electrode pads 15 and four alignment symbols 3 are formed on the probe installation surface 17, and probes 16 are attached to the respective probe electrode pads 15. The probe 16 is disposed at a position corresponding to an electrode pad of a semiconductor wafer as an inspection object. The alignment symbols 3 are formed at substantially equal intervals on the outer peripheral edge portion of the wiring substrate 14.

The probe electrode pad 15 and the alignment symbol 3 are a metal film or a resin film formed on the probe installation surface 17 by photolithography processing using an electroplating method or an etching method. The alignment symbol 3 includes an identification region 30 and a peripheral region 31. The identification region 30 is made of a metal material having high reflectance, and is a thin film having a planar shape of a predetermined geometric figure, for example, a circular Au film. The peripheral region 31 is a region surrounding the identification region 30, and is a thin film having a reflectance lower than that of the identification region 30, for example, a resin film. By making the reflectance of the identification region 30 and the peripheral region 31 different from each other, it is possible to easily identify the contour of the identification region 30 from the captured image acquired by camera capturing.

FIGS. 10(a) to 10(d) are diagrams illustrating various states that can occur in the alignment symbol 3. (a) of the drawing illustrates a state of the normal alignment symbol 3. (b) of the drawing is an example of a case where a foreign substance 32 adheres to the peripheral region 31. When the reflectance of the foreign substance 32 is high, the contour of the identification region 30 cannot be correctly extracted, and the alignment symbol 3 may not be correctly recognized. (c) of the drawing is an example of a case where a stain 33 occurs in the peripheral region 31 and the reflectance varies in the peripheral region 31. Also in this case, the alignment symbol 3 may not be correctly recognized. (d) of the drawing is an example of a case where a flaw 34 occurs in the identification region 30. The contour of the identification region 30 changes, and the alignment symbol 3 may not be correctly recognized.

In the conventional probe card, when a defect such as a scratch or dirt is found in the identification region 30 or the peripheral region 31 of the alignment symbol 3, there is a problem that it is necessary to remanufacture the entire wiring substrate 14. Since the alignment symbol 3 is formed on the wiring substrate 14 by photolithography processing, the alignment symbol 3 in which a defect is found cannot be repaired. Therefore, if there is a defect in the alignment symbol 3 or the like, even if there is no problem in the probe electrode pad 15 or the like, it is necessary to discard it as a defective product, which causes a problem that the yield of the wiring substrate 14 is reduced.

As a conventional method for forming an alignment symbol, a method using a sheet-like member has been proposed (for example, Patent Literature 1). Patent Literature 1 describes a method in which a light reflecting member made of a metal member having a light reflecting surface is formed on a wiring substrate, a sheet-like member having a non-light reflecting surface or a light diffusing surface is bonded to cover the light reflecting surface, and then an opening is formed in the sheet-like member by laser processing to partially expose the light reflecting surface, thereby forming an alignment symbol on the wiring substrate.

This method is not a repair method in a case where there is a defect in the alignment symbol, but is a method of attaching a sheet-like member, and thus is considered to be applicable to repair of a defect in a peripheral region, but there is a problem that a defect in an identification region cannot be repaired. Further, it is conceivable to repair the defect of the symbol by a method of forming the light reflecting member on the defective alignment symbol and further attaching the sheet-shaped member on the light reflecting member. However, the sheet-shaped member becomes too high and may come into contact with the inspection object.

In the conventional probe card, there is a problem that the alignment symbol cannot be provided on the wiring substrate after the wiring substrate is manufactured.

CITATION LIST

Patent Literature

Patent Literature 1: JP 2001-330626 A

SUMMARY OF INVENTION

Technical Problem

The present invention has been made in view of the above circumstances, and an object of the present invention is to provide a probe card in which an alignment symbol is formed on a wiring substrate using a high reflection chip for alignment. In particular, an object is to provide a probe card capable of repairing a defect generated in an alignment symbol.

Further, an object of the present invention is to provide a method for repairing a probe card in which a defect occurs in an alignment symbol using a high reflection chip for alignment.

Solution to Problem

A probe card according to a first aspect of the present invention includes: a probe that is brought into contact with an inspection object; a wiring substrate to which the probe is attached; and a high reflection chip for alignment provided on a probe installation surface of the wiring substrate. The high reflection chip is made of a metal plate having a through-hole, and has an affixing surface which is a surface attached to the probe installation surface via an adhesive, and a mirror-finished high reflection surface which is an other surface, and has a ridge in which the adhesive formed on the affixing surface extends into the through-hole.

By attaching the high reflection chip via the adhesive, the high reflection chip having a minute area can be easily attached onto the wiring substrate. In addition, since the adhesive formed on the affixing surface has the ridge extending into the through-hole, the high reflection chip can be firmly attached onto the wiring substrate, and falling off can be prevented. Furthermore, since the photolithography processing is not required, an alignment symbol can be added to the wiring substrate afterwards, and for example, a wiring substrate having a defect in the alignment symbol can be repaired.

In addition to the above configuration, a probe card according to a second aspect of the present invention includes a low reflection sheet that is formed in a sheet shape having a chip arrangement hole corresponding to the high reflection chip, having a low reflection surface which is a surface having a light reflectance lower than that of the high reflection surface, and having an attached surface which is an other surface attached to the probe installation surface. The high reflection chip is attached onto the probe installation surface exposed through the chip arrangement hole.

By adopting such a configuration, it is possible to easily recognize from the camera image at the time of alignment by being surrounded by the low reflection surface and increasing the contrast of the contour of the high reflection surface. In addition, a low reflection sheet can be added to the wiring substrate afterwards, and for example, a wiring substrate having a defect in a peripheral region of the alignment symbol can be repaired. Furthermore, the high reflection chip and the low reflection sheet are disposed without overlapping each other, the heights of the high reflection chip and the low reflection sheet on the probe affixing surface can be suppressed, and the contact with the inspection object can be avoided.

In addition to the above configuration, the probe card according to a third aspect of the present invention is configured such that the low reflection sheet is made of a resin sheet containing carbon, and is attached using a double-sided tape.

By adopting such a configuration, the low reflection sheet having a larger area can be attached with the double-sided tape, and the high reflection chip having a smaller area can be attached with the adhesive, so that the attaching operation can be facilitated. In addition, the low reflection sheet can prevent the adhesive from spreading on the wiring substrate, and the attaching work can be facilitated.

In a method for repairing a probe card according to a fourth aspect of the present invention, the probe card includes a wiring substrate having a probe installation surface on which a probe electrode pad for attaching a probe and an alignment symbol for performing alignment before inspection are formed. The method includes: attaching, on the probe installation surface, an attached surface on an other side of the low reflection surfaces of the low reflection sheet; attaching, on the probe installation surface, an affixing surface on an other side of the high reflection surface of a flat plate-shaped high reflection chip having a high reflection surface having a light reflectance higher than that of the low reflection surface, the high reflection chip is attached onto the alignment symbol exposed in a chip arrangement hole of the low reflection sheet attached onto the wiring substrate via an adhesive, and the adhesive is cured while entering a through-hole of the high reflection chip from the affixing surface side of the high reflection chip at the time of attaching the high reflection chip.

By adopting such a configuration, it is possible to repair a probe card in which a defect occurs in an alignment symbol. In addition, the low reflection sheet can prevent the adhesive for the high reflection chip from spreading on the wiring substrate. Further, by disposing the high reflection chip in the chip arrangement hole of the low reflection sheet, the attaching work can be facilitated. Further, by arranging the high reflection chip in the chip arrangement hole of the low reflection sheet, the height of the alignment symbol after repair can be suppressed, and the contact with the inspection object can be avoided.

Advantageous Effects of Invention

According to the present invention, it is possible to provide a probe card in which an alignment symbol is formed on a wiring substrate using a high reflection chip for alignment. In particular, it is possible to provide a probe card capable of repairing a defect generated in an alignment symbol.

Further, it is possible to provide a method for repairing a probe card in which a defect occurs in an alignment symbol using a high reflection chip for alignment.

DESCRIPTION OF EMBODIMENTS

First Embodiment (1) Probe Card 10

Figure 1:
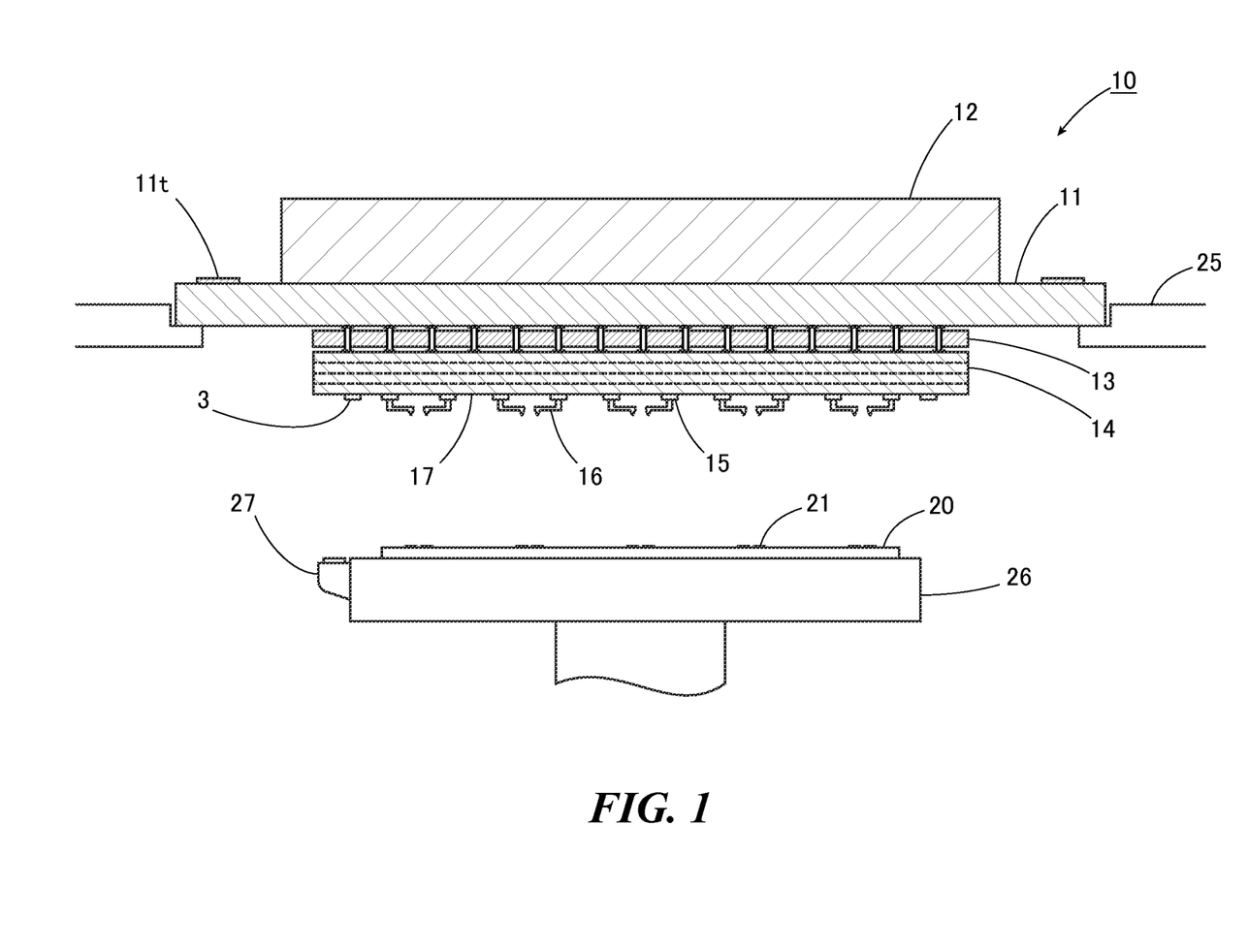
FIG. 1 is a view illustrating an example of a schematic configuration of a probe card 10 according to a first embodiment of the present invention.

FIG. 1 is a view illustrating an example of a schematic configuration of a probe card 10 according to a first embodiment of the present invention. The probe card 10 is attached to the wafer prober with a probe installation surface 17 facing downward, faces an electrode pad 21 of a semiconductor wafer 20 placed on a stage 26, and moves the stage 26 up and down, so that the probe 16 can be brought into contact with the electrode pad 21.

The probe card 10 includes a main substrate 11, a reinforcing plate 12, an interposer 13, a space transformer (ST) substrate 14, and two or more probes 16.

The main substrate 11 is a wiring substrate detachably attached to the wafer prober, and for example, a disk-shaped glass epoxy substrate is used. The outer peripheral edge portion of the lower surface of the main substrate 11 is supported by a card holder 25 of the wafer prober and is arranged substantially horizontally. The reinforcing plate 12 for suppressing distortion of the main substrate 11 is attached to a central portion of the upper surface of the main substrate 11, and two or more external terminals 11t to which signal terminals of a tester device (not illustrated) are connected are provided at an outer peripheral edge portion of the upper surface.

The interposer 13 is a connection means disposed between the main substrate 11 and the ST substrate 14 and connecting the wiring of the main substrate 11 and the wiring of the ST substrate 14, and includes, for example, a large number of pogo pins.

The ST substrate 14 is a multilayer wiring substrate that converts the electrode pitch, for example, a laminate obtained by bonding two or more ceramic plates. The ST substrate 14 is disposed on the lower surface side of the main substrate 11 via the interposer 13. The probe installation surface 17 is a lower surface of the ST substrate 14, and two or more probe electrode pads 15 and two or more alignment symbols 3 are formed.

The probe electrode pad 15 and the alignment symbol 3 are a metal film or a resin film formed on the probe installation surface 17 by photolithography processing using an electroplating method or an etching method. The probe electrode pad 15 is an electrode to which a probe is connected, and is formed so as to correspond to the electrode pad 21 on the semiconductor wafer 20.

The stage 26 is a mounting table for the semiconductor wafer 20, and can move and rotate in a horizontal plane and move in a vertical direction. A camera 27 is an imaging means that captures an image of the alignment symbol 3, detects the position of the alignment symbol 3 by capturing an image while moving the stage 26, and positions the semiconductor wafer 20 with respect to the probe card 10.

(2) Initial Symbol 3A

Figure 2:
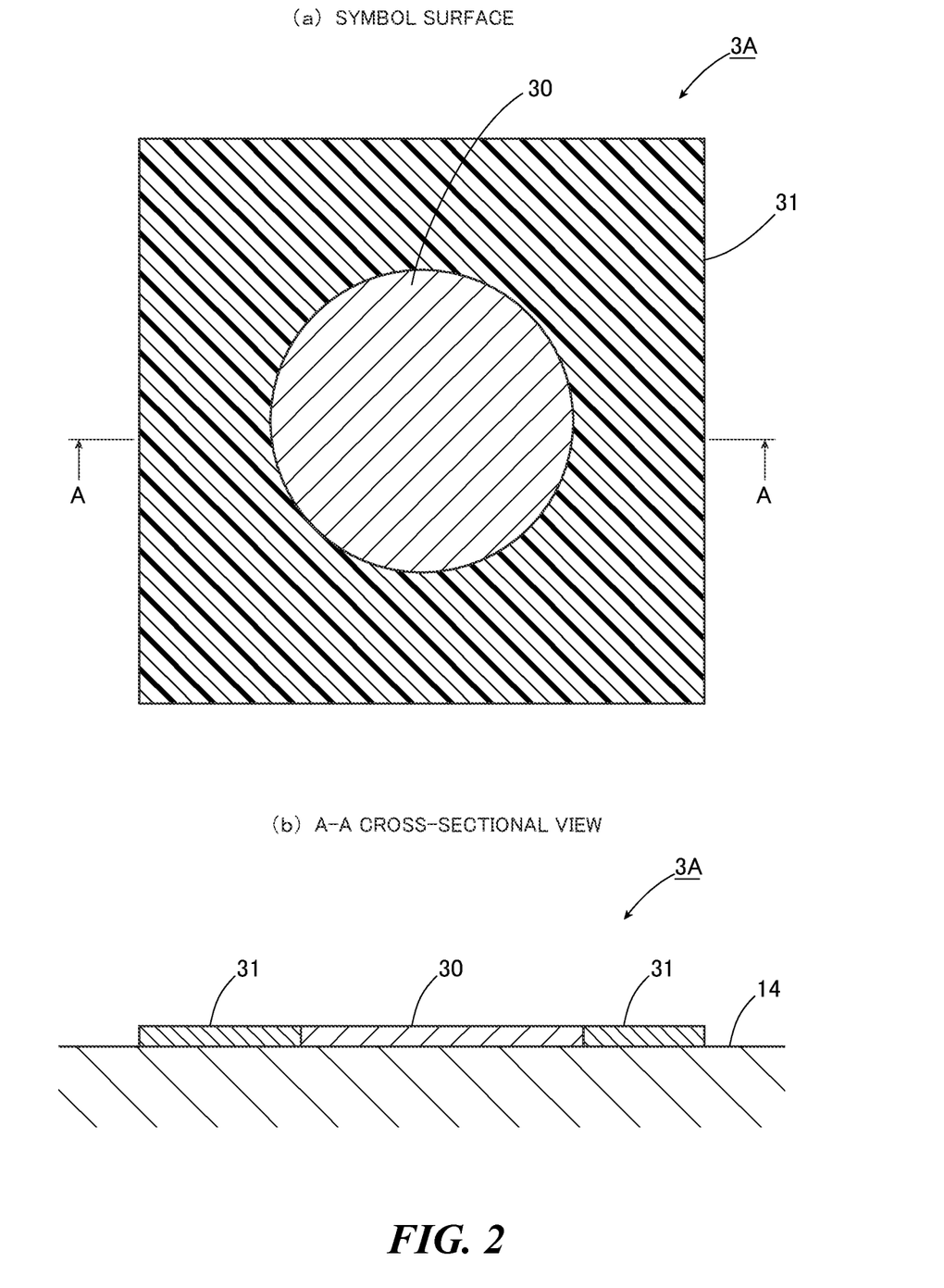
FIG. 2 is a diagram illustrating a configuration example of an initial symbol 3A.

FIG. 2 is a diagram illustrating a configuration example of an initial symbol 3A, in which (a) is a plan view of a symbol surface captured by the camera 27, and (b) is a cross-sectional view (A-A cross-sectional view) illustrating a state when cut along an A-A cutting line.

The initial symbol 3A is an alignment symbol 3 formed on the wiring substrate 14 by photolithography processing, and includes an identification region 30 and a peripheral region 31. The identification region 30 is a region formed as a high reflection surface having a high light reflectance, and is made of, for example, a metal film formed on the wiring substrate 14. The peripheral region 31 is a region formed as a low reflection surface having a light reflectance lower than that of the identification region 30, and is made of, for example, a resin film formed on the wiring substrate 14. The peripheral region 31 is formed so as to surround the identification region 30, and the contour of the identification region 30 can be easily recognized in the camera image at the time of alignment. Although the illustrated identification region 30 is circular and the peripheral region 31 is rectangular, any shape can be adopted.

(3) Repair Symbol 3B

Figure 3:
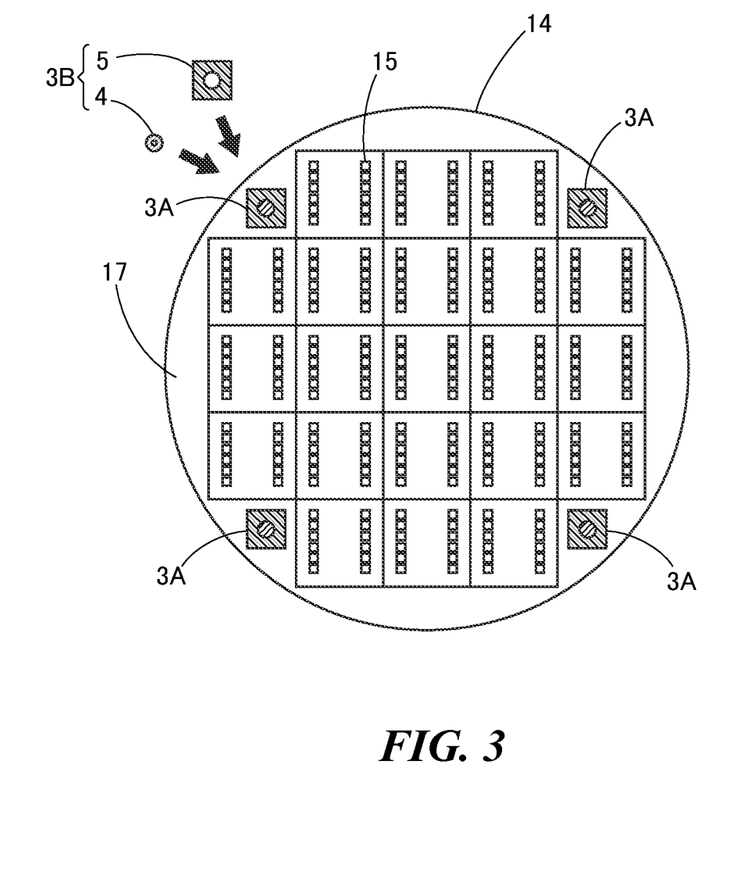
FIG. 3 is a diagram schematically illustrating a state at the time of symbol repair.
Figure 4:
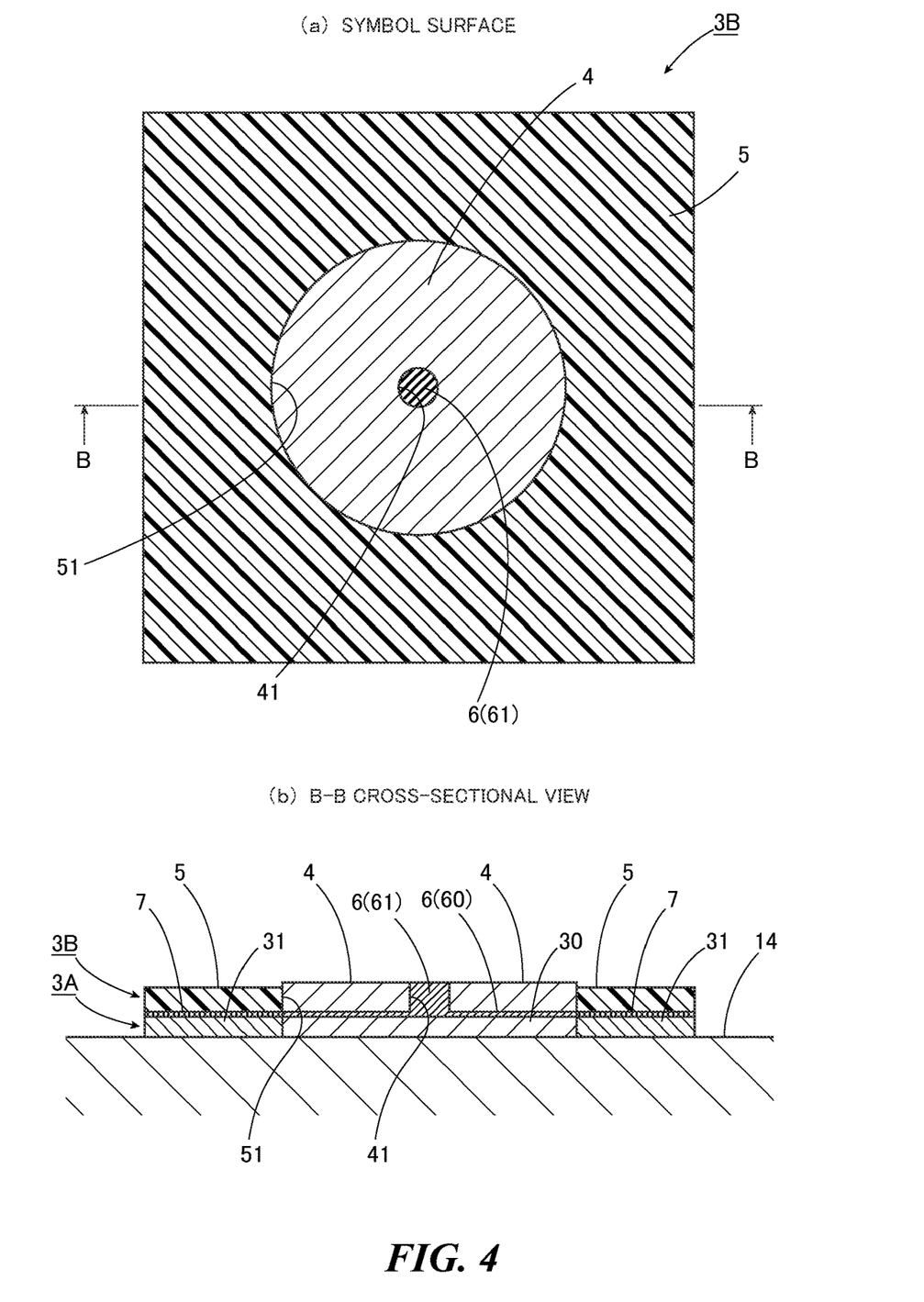
FIG. 4 is a diagram illustrating a configuration example of a repair symbol 3B

FIG. 3 is a diagram schematically illustrating a state at the time of symbol repair. FIG. 4 is a diagram illustrating a configuration example of a repair symbol 3B, in which (a) is a plan view of a symbol surface captured by the camera 27, and (b) is a cross-sectional view (B-B cross-sectional view) illustrating a state cut along a B-B cutting line.

The repair symbol 3B is an alignment symbol 3 formed by repairing the wiring substrate 14 when a defect is found in the initial symbol 3A. In a case where two or more initial symbols 3A are formed on the wiring substrate 14, symbol repair can be performed for all the initial symbols 3A, or can be performed only for some of the initial symbols 3A.

The repair symbol 3B is an alignment symbol 3 formed on the initial symbol 3A, and includes a high reflection chip 4 and a low reflection sheet 5. The high reflection chip 4 is a metal plate having a high reflection surface and an affixing surface, and is attached onto the initial symbol 3A. The high reflection surface is a surface having a high light reflectance, for example, a mirror-finished surface, and forms an identification region whose contour is identified by the camera 27. The affixing surface is the other surface of the high reflection surface, and is attached onto the identification region 30 of the initial symbol 3A via an adhesive 6.

The low reflection sheet 5 is a sheet material having a low reflection surface and an attached surface, for example, a resin sheet containing carbon, and is attached onto the initial symbol 3A. The low reflection surface is a surface having a lower light reflectance than the high reflection surface of the high reflection chip 4, and forms a peripheral region that improves the contrast of the contour of the high reflection surface. The attached surface is the other surface of the low reflection surface, and is attached onto the peripheral region 31 of the initial symbol 3A via a double-sided tape 7.

Although the illustrated high reflection chip 4 has a circular shape and the low reflection sheet 5 has a rectangular shape, any shape can be adopted. It is desirable that the outer shapes of the high reflection chip 4 and the low reflection sheet 5 respectively coincide with the outer shapes of the identification region 30 and the peripheral region 31 of the initial symbol 3A, but may be different.

The low reflection sheet 5 has a chip arrangement hole 51, and the high reflection chip 4 is arranged in the chip arrangement hole 51. Therefore, the high reflection surface of the high reflection chip 4 is surrounded by the low reflection surface of the low reflection sheet 5, and the contour of the high reflection surface of the high reflection chip 4 can be easily recognized in the camera image at the time of alignment. Further, the chip arrangement hole 51 is a through-hole of the low reflection sheet 5 and has a shape corresponding to the high reflection chip 4. Therefore, the high reflection chip 4 can be disposed on the wiring substrate 14 without overlapping the low reflection sheet 5. Therefore, the height of the repair symbol 3B on the wiring substrate 14 can be suppressed.

The high reflection chip 4 has a fixing through-hole 41. The adhesive 6 is provided not only on the affixing surface of the high reflection chip 4 but also in the fixing through-hole 41. By filling the fixing through-hole 41 with the adhesive 6, the high reflection chip 4 is firmly fixed to the wiring substrate 14 and is less likely to fall off.

The adhesive 6 includes a thin layer portion 60 disposed between the affixing surface and the identification region 30, and a ridge 61 raised in the vertical direction from the thin layer portion 60 toward the inside of the fixing through-hole 41, and the thin layer portion 60 and the ridge 61 are continuously formed. The ridge 61 may have any shape as long as it extends from the affixing surface side of the high reflection chip 4 toward the inside of the fixing through-hole 41, and the inside of the fixing through-hole 41 may not be completely filled with the adhesive 6. That is, the ridge 61 may not reach the high reflection surface of the high reflection chip 4, and a space may remain on the high reflection surface side in the fixing through-hole 41.

(4) Symbol Repairing Method

Figure 5:
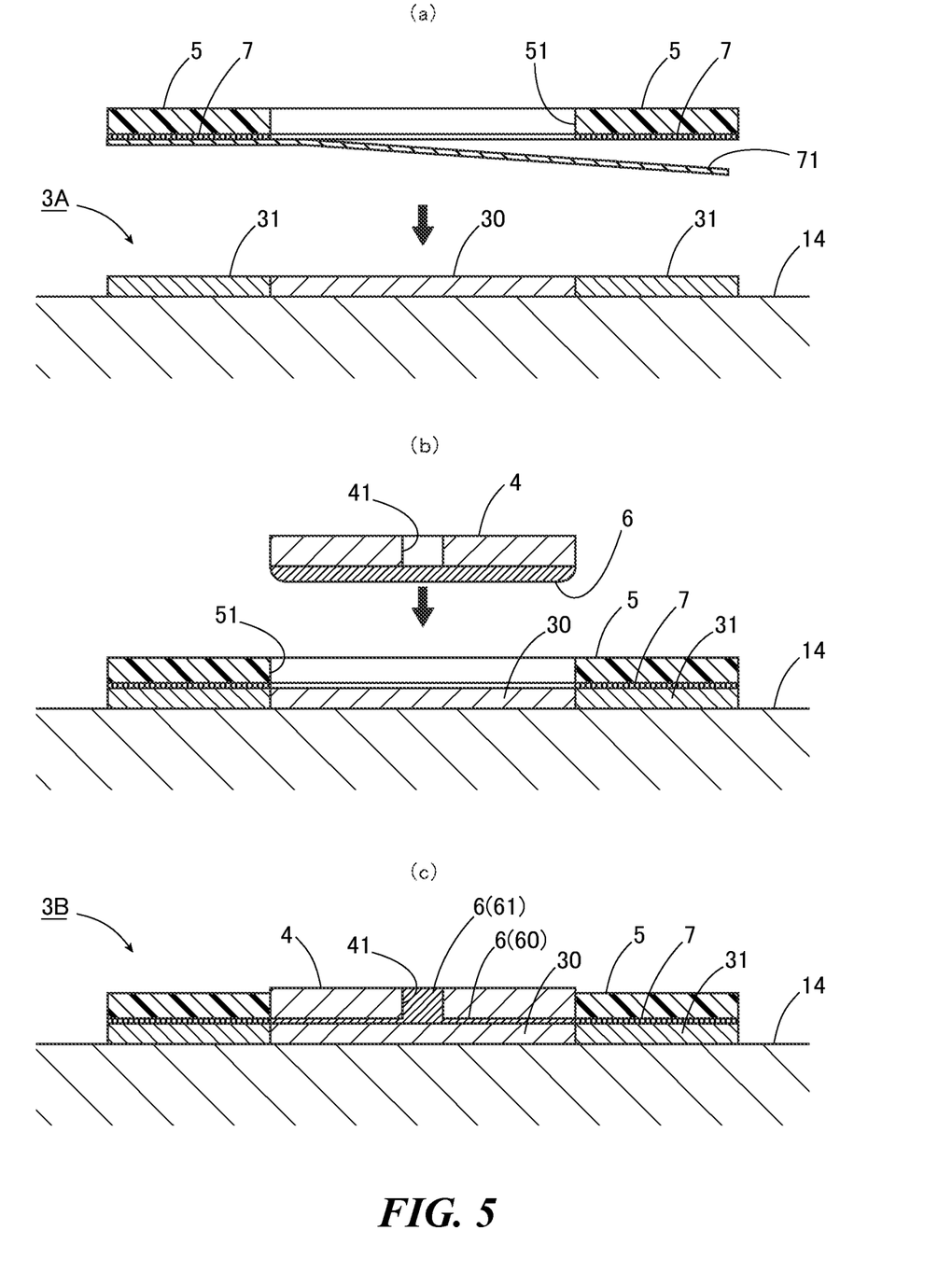
FIGS. 5(a) to 5(c) are diagrams illustrating an example of a state at the time of symbol repair in time series.

FIGS. 5(a) to 5(c) are diagrams illustrating an example of a state at the time of symbol repair in time series. (a) of the drawing illustrates a state in which the low reflection sheet 5 is attached. A release paper 71 of the double-sided tape 7 attached to the attached surface of the low reflection sheet 5 is peeled off, and the low reflection sheet 5 is attached onto the initial symbol 3A. At this time, the low reflection sheet 5 is attached to a position corresponding to the peripheral region 31. The chip arrangement hole 51 is formed in advance in the low reflection sheet 5 before being attached onto the wiring substrate 14.

(b) in the drawing illustrates a state in which the high reflection chip 4 is attached. The high reflection chip 4 is attached after the low reflection sheet 5 is attached. After the adhesive 6 is applied to the affixing surface, the high reflection chip 4 is attached onto the initial symbol 3A exposed in the chip arrangement hole 51 of the low reflection sheet 5. At this time, the high reflection chip 4 is attached to a position corresponding to the identification region 30. By attaching using the adhesive 6 or by disposing the adhesive 6 in the chip arrangement hole 51 of the previously attached low reflection sheet 5, the high reflection chip 4 having a minute area can be easily attached.

(c) in the drawing illustrates a state after the high reflection chip 4 is attached. When the high reflection chip 4 is attached, the adhesive 6 applied to the affixing surface enters the fixing through-hole 41 by the pressing force applied to the high reflection chip 4. By curing the adhesive 6 in this state, the ridge 61 extending from the thin layer portion 60 on the affixing surface side of the high reflection chip 4 into the fixing through-hole 41 is formed.

The adhesive 6 is a liquid at the time of application to the high reflection chip 4, but a material that is cured by subsequent drying, heating, or chemical reaction, for example, a black epoxy resin is used. By arranging the high reflection chip 4 in the chip arrangement hole 51 of the low reflection sheet 5, the adhesive 6 before curing does not flow out to the outside of the chip arrangement hole 51, and the adhesive 6 can be prevented from flowing and spreading on the wiring substrate 14.

In addition, the adhesive 6 desirably has a lower reflectance than the high reflection surface of the high reflection chip 4, and desirably contains carbon. For example, when the adhesive 6 contains powdered carbon, the reflectance is low. Therefore, when the adhesive 6 is formed in the gap between the high reflection chip 4 and the low reflection sheet 5, it is possible to prevent the contrast of the contour of the high reflection chip 4 from decreasing.

(5) Method of Manufacturing High Reflection Chip 4

FIGS. 6(a) to 6(e) are views illustrating an example of a method of manufacturing the high reflection chip 4 in time series. A photoresist 401 is applied to one surface of a metal plate 400 and exposed and developed to selectively remove a partial region. As a result, the photoresist 401 is formed on one surface of the high reflection chip 4, for example, in a region corresponding to the high reflection surface ((a) in the drawing). Next, a region of one surface of the metal plate 400 where the photoresist 401 is not formed is etched to form a recess 402 ((b) in the drawing).

Figure 6:
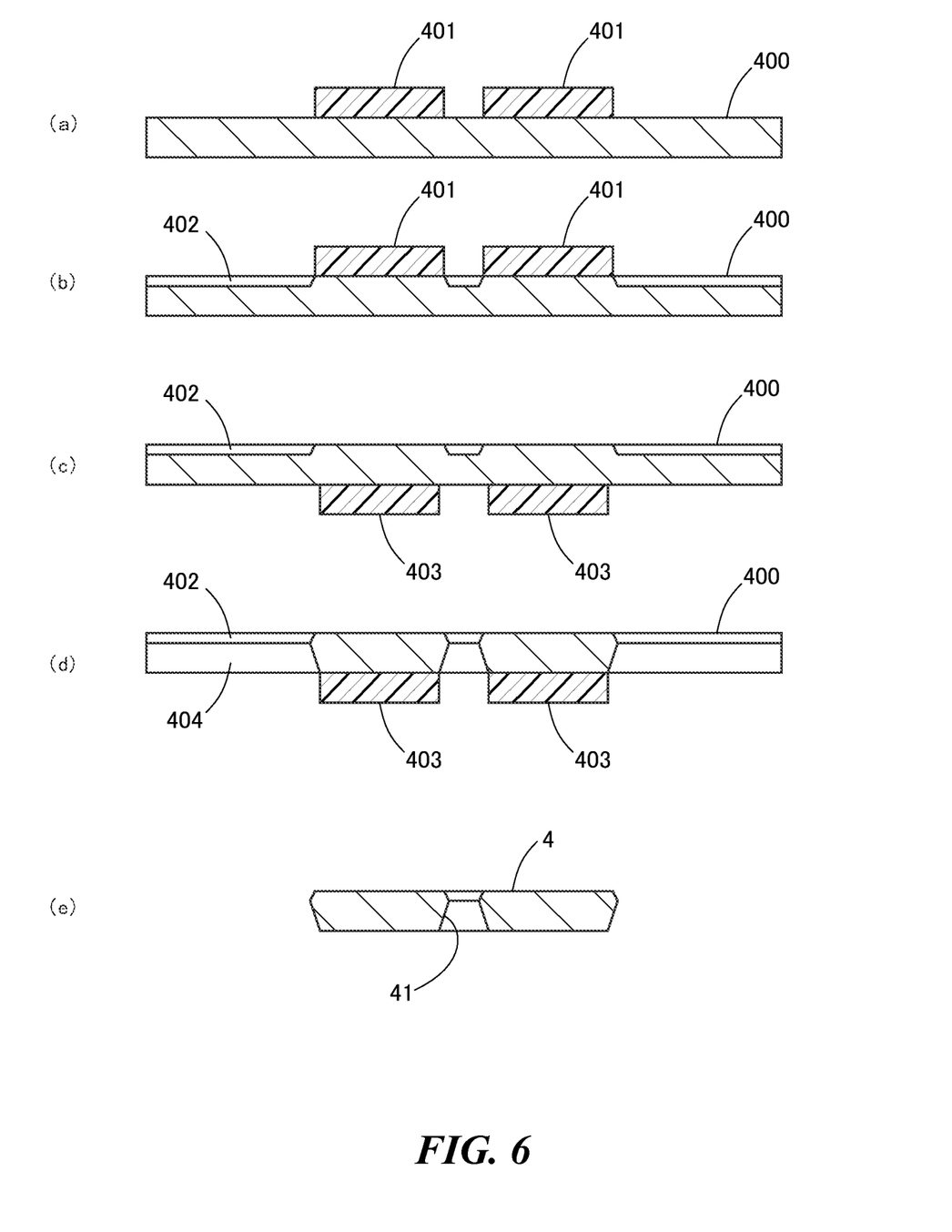
FIGS. 6(a) to 6(e) are views illustrating an example of a method of manufacturing the high reflection chip 4 in time series.

Thereafter, a photoresist 403 is also applied to the other surface of the metal plate 400, and exposed and developed to selectively remove a part of the region. As a result, the photoresist 403 is formed on the other surface of the high reflection chip 4, for example, in a region corresponding to the affixing surface ((c) in the drawing). Next, a region of the other surface of the metal plate 400 where the photoresist 403 is not formed is etched to form a recess 404 ((d) in the drawing). At this time, the outer peripheral surface and the fixing through-hole 41 are formed by the upper and lower recesses 402 and 404 facing each other, and the high reflection chip 4 is obtained ((e) in the drawing).

Second Embodiment

In the first embodiment, an example of forming the repair symbol 3B by attaching the high reflection chip 4 and the low reflection sheet 5 on the initial symbol 3A has been described, but in the present embodiment, a case of forming a repair symbol 3C by attaching only the high reflection chip 4 will be described. Note that the same components as those in the first embodiment are denoted by the same reference numerals, and redundant description will be omitted.

Figure 7:
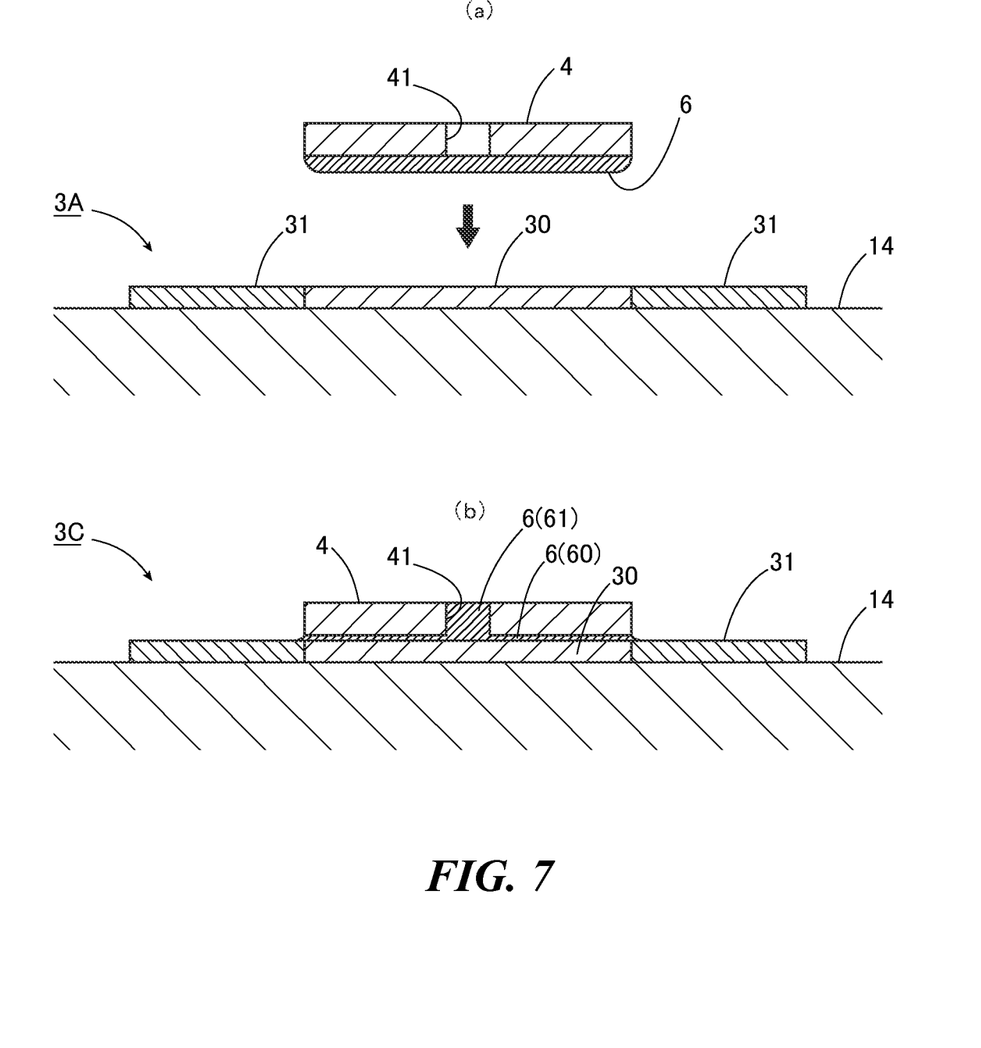
FIGS. 7(a) and 7(b) are time-series diagrams illustrating an example of a state at the time of symbol repair according to the second embodiment.

FIGS. 7(a) and 7(b) are time-series diagrams illustrating an example of a state at the time of symbol repair according to the second embodiment. The repair symbol 3C is an alignment symbol 3 formed by repair performed when a defect is found in the identification region 30 of the initial symbol 3A, and includes the high reflection chip 4 and the peripheral region 31 of the initial symbol 3A. That is, the repair symbol 3C is different from the repair symbol 3B (first embodiment) in that the low reflection sheet 5 is not used.

The repair symbol 3C is formed by attaching the high reflection chip 4 on the initial symbol 3A. Since the high reflection surface of the high reflection chip 4 is surrounded by the low reflection surface of the peripheral region 31 having a lower light reflectance, the contour of the high reflection chip 4 can be easily recognized in the camera image at the time of alignment.

As in the case of the first embodiment, the high reflection chip 4 is attached onto the initial symbol 3A via the adhesive 6. Therefore, the high reflection chip 4 having a minute area can be easily attached. In addition, the high reflection chip 4 has the fixing through-hole 41, and is formed such that the adhesive 6 extends into the fixing through-hole 41. Therefore, the high reflection chip 4 can be firmly fixed so as not to easily fall off.

Third Embodiment

In the above embodiment, an example in which a repair symbol is formed on the initial symbol 3A when there is a defect in the initial symbol 3A has been described. On the other hand, in the present embodiment, a case where an additional symbol 3D is newly formed in a region where the initial symbol 3A is not formed on the wiring substrate 14 will be described. Note that the same components as those in the first embodiment are denoted by the same reference numerals, and redundant description will be omitted.

Figure 8:
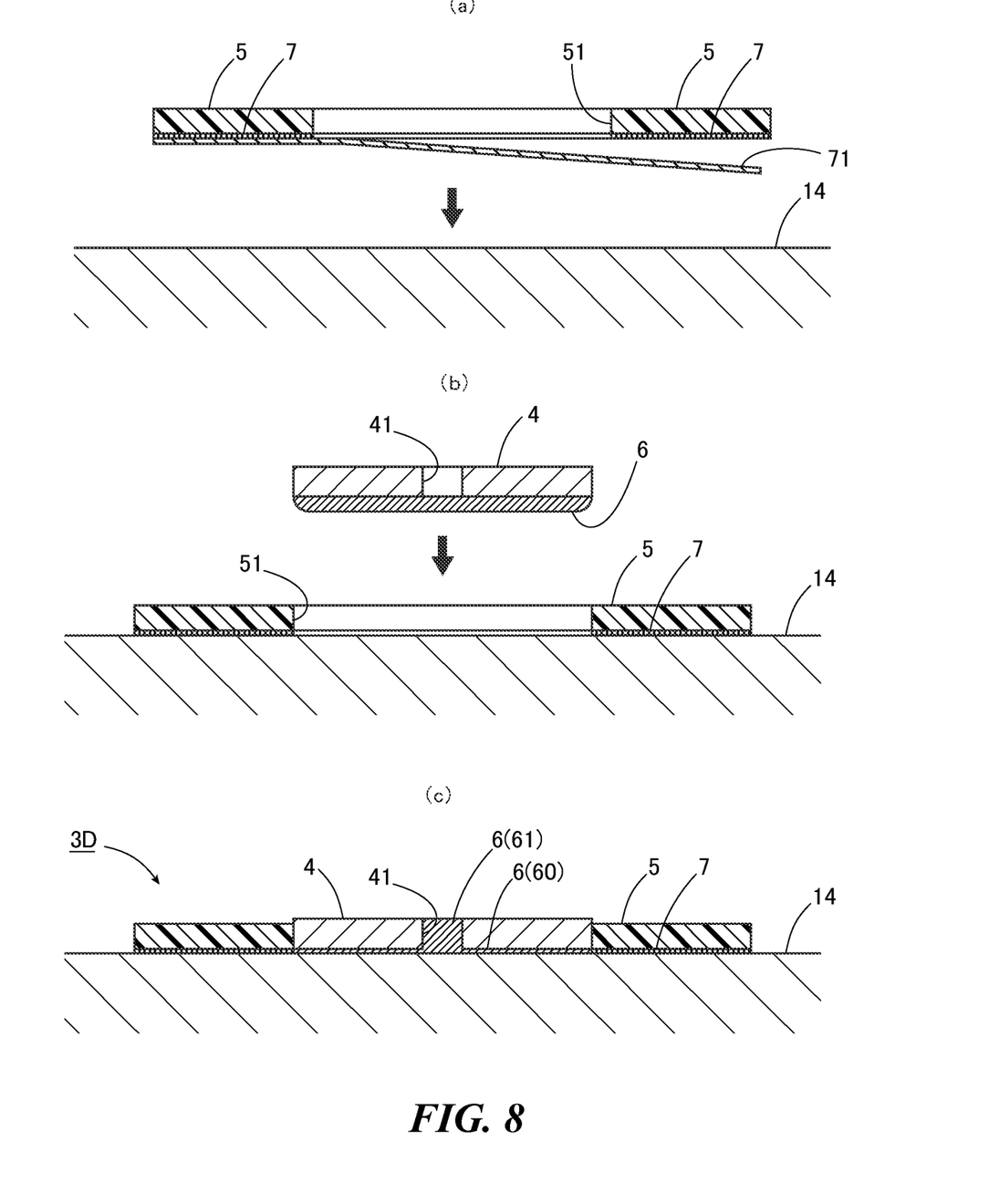
FIGS. 8(a) to 8(c) are diagrams illustrating an example of a state at the time of symbol formation according to the third embodiment in time series.

FIGS. 8(a) to 8(c) are diagrams illustrating an example of a state at the time of symbol formation according to the third embodiment in time series. The additional symbol 3D is the alignment symbol 3 formed on the wiring substrate 14 without using photolithography processing. The additional symbol 3D is different from the repair symbols 3B and 3C (first and second embodiments) in that the additional symbol 3D is not formed to repair the initial symbol 3A but is the alignment symbol 3 newly formed in a region where the initial symbol 3A is not formed on the wiring substrate 14.

(a) of the drawing illustrates a state in which the low reflection sheet 5 is attached. The release paper 71 of the double-sided tape 7 attached to the attached surface of the low reflection sheet 5 is peeled off, and the low reflection sheet 5 is attached onto the wiring substrate 14.

(b) in the drawing illustrates a state in which the high reflection chip 4 is attached. The high reflection chip 4 is attached after the low reflection sheet 5 is attached. After the adhesive 6 is applied to the affixing surface, the high reflection chip 4 is attached onto the wiring substrate 14 exposed in the chip arrangement hole 51 of the low reflection sheet 5.

(c) in the drawing illustrates a state after the high reflection chip 4 is attached. By attaching the high reflection chip 4, the adhesive 6 applied to the affixing surface enters the fixing through-hole 41. By curing the adhesive 6 in this state, the ridge 61 extending from the thin layer portion 60 on the affixing surface side of the high reflection chip 4 into the through-hole 41 is formed.

DESCRIPTION OF REFERENCE NUMERALS 10 probe card
11 main substrate
12 reinforcing plate
13 interposer
14 ST substrate
15 probe electrode pad
16 probe
17 probe installation surface
27 camera
3 alignment symbol
3A initial symbol
3B, 3C repair symbol
3D additional symbol
30 identification region
31 peripheral region
32 foreign substance
33 stain
34 flaw
4 high reflection chip
41 fixing through-hole
400 metal plate
401, 403 photoresist
402, 404 recess
5 low reflection sheet
6 adhesive
60 thin layer portion
61 ridge
7 double-sided tape
71 release paper

The invention claimed is:

1. A probe card comprising:
a probe that is brought into contact with an inspection object;
a wiring substrate to which the probe is attached; and
a high reflection chip for alignment provided on a probe installation surface of the wiring substrate, wherein
the high reflection chip is made of a metal plate having a through-hole, and has an affixing surface to be attached to the probe installation surface via an adhesive, and a high reflection surface mirror-finished on an other side of the affixing surface, and has a ridge in which the adhesive formed on the affixing surface extends into the through-hole.

2. The probe card according to claim 1, comprising:
a low reflection sheet that is formed in a sheet shape having a chip arrangement hole corresponding to the high reflection chip, having a low reflection surface having a light reflectance lower than that of the high reflection surface, and having an attached surface on an other side of the low reflection surface attached to the probe installation surface, wherein
the high reflection chip is attached onto the probe installation surface exposed through the chip arrangement hole.

3. The probe card according to claim 2, wherein the low reflection sheet is made of a resin sheet containing carbon, and is attached using a double-sided tape.

4. A method for repairing a probe card including a wiring substrate having a probe installation surface on which a probe electrode pad for attaching a probe and an alignment symbol for positioning before inspection are formed, the method comprising:
attaching, on the probe installation surface, an attached surface on an other side of the low reflection surfaces of the low reflection sheet; and
attaching, on the probe installation surface, an affixing surface on an other side of the high reflection surface of a flat plate-shaped high reflection chip having a high reflection surface having a light reflectance higher than that of the low reflection surface, wherein
the high reflection chip is attached onto the alignment symbol exposed in a chip arrangement hole of the low reflection sheet attached onto the wiring substrate via an adhesive, and
the adhesive is cured while entering a through-hole of the high reflection chip from the affixing surface side of the high reflection chip at the time of attaching the high reflection chip.

* * * * *